United States Patent
Yokoe et al.

(10) Patent No.: US 8,581,378 B2
(45) Date of Patent: Nov. 12, 2013

(54) SEMICONDUCTOR DEVICE AND METHOD OF MANUFACTURING THE SAME

(75) Inventors: Toshiyuki Yokoe, Osaka (JP); Chie Fujioka, Kyoto (JP); Daichi Kumano, Kyoto (JP)

(73) Assignee: Panasonic Corporation, Osaka (JP)

( * ) Notice: Subject to any disclaimer, the term of this patent is extended or adjusted under 35 U.S.C. 154(b) by 463 days.

(21) Appl. No.: 12/934,814

(22) PCT Filed: Sep. 29, 2009

(86) PCT No.: PCT/JP2009/004963
§ 371 (c)(1),
(2), (4) Date: Sep. 27, 2010

(87) PCT Pub. No.: WO2011/039795
PCT Pub. Date: Apr. 7, 2011

(65) Prior Publication Data
US 2011/0115062 A1    May 19, 2011

(51) Int. Cl.
*H01L 23/495* (2006.01)

(52) U.S. Cl.
USPC ........... 257/676; 257/666; 257/678; 257/692; 257/E23.031; 257/E23.034; 257/E23.044; 257/E23.056; 257/E23.084; 257/E21.518; 438/117; 438/123; 438/124; 438/617

(58) Field of Classification Search
USPC ............... 257/666, 676, 678, 692, E23.031, 257/E23.034, E23.044, E23.506, E23.084, 257/E21.518; 438/117, 123, 124, 617
See application file for complete search history.

(56) References Cited

U.S. PATENT DOCUMENTS

| | | | |
|---|---|---|---|
| 4,891,333 A | 1/1990 | Baba et al. | |
| 7,888,697 B2 * | 2/2011 | Kawanobe et al. | 257/98 |
| 2002/0047186 A1 * | 4/2002 | Tellkamp | 257/666 |
| 2008/0265386 A1 * | 10/2008 | Muto et al. | 257/676 |
| 2009/0015269 A1 | 1/2009 | Pinto et al. | |
| 2009/0051022 A1 | 2/2009 | Andoh | |

FOREIGN PATENT DOCUMENTS

| | | |
|---|---|---|
| JP | 10-284529 | 10/1998 |
| JP | 11-026672 | 1/1999 |
| JP | 2001-007274 | 1/2001 |
| JP | 2003-209132 | 7/2003 |
| JP | 2005-353976 | 12/2005 |
| JP | 2008-117825 | 5/2008 |

* cited by examiner

*Primary Examiner* — Meiya Li
(74) *Attorney, Agent, or Firm* — Hamre, Schumann, Mueller & Larson, P.C.

(57) ABSTRACT

Terminals (2*b*, 2*c*) are divided into two along a common boundary, coatings (10, 11) most suitable for two conductive bonding materials (5, 6) to be used are exposed on the terminals (2*b*, 2*c*), the most suitable one of the coatings (10, 11) is selected, and the corresponding conductive bonding material (5, 6) is bonded onto the coating. Thus it is possible to improve the reliability of bonding and easily reduce a bonding resistance while suppressing a decrease in the reliability of a semiconductor element 3.

13 Claims, 3 Drawing Sheets

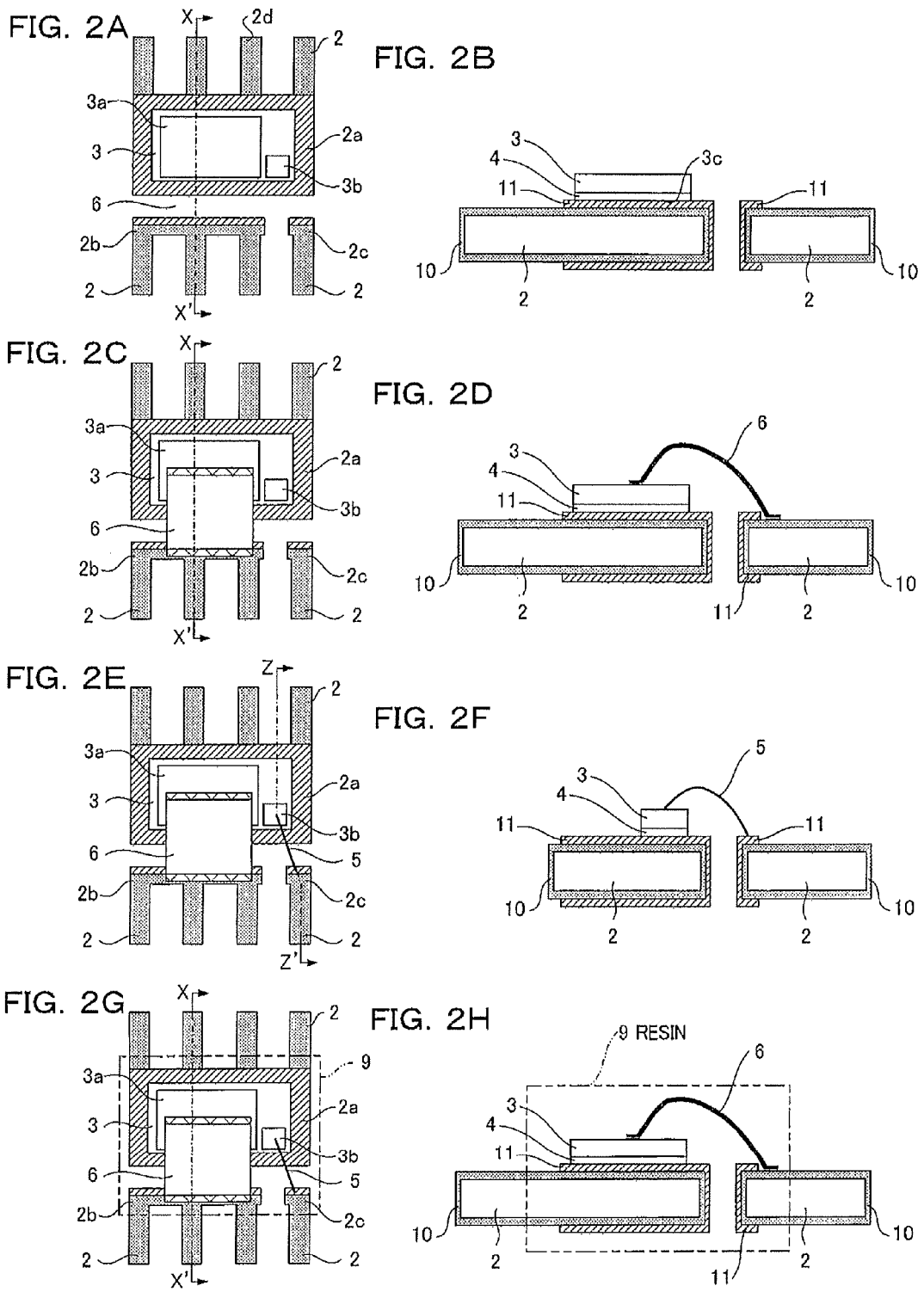

US 8,581,378 B2

SEMICONDUCTOR DEVICE AND METHOD OF MANUFACTURING THE SAME

TECHNICAL FIELD

The present invention relates to a semiconductor device in which terminals are electrically connected via multiple kinds of conductive bonding materials, and a method of manufacturing the same.

BACKGROUND ART

There has been an increasing demand for higher power and a higher withstand voltage in lead frames and semiconductor devices of the prior art, e.g., power semiconductor devices in which power semiconductor elements such as a MOS-FET and an IGBT are mounted. Thus in some semiconductor elements and packages for the semiconductor elements in response to the demand, an electrical resistance at the joint of the semiconductor element and an external terminal is reduced by a strip of Al (aluminum ribbon) to apply a large current with a low resistance. In order to further reduce a resistance and improve connection stability, however, multiple Al ribbons are connected in a stacked manner with an increased cross sectional area.

FIGS. 3(a) to 3(c) show the configuration of a semiconductor device of the prior art. The semiconductor device is a power semiconductor device. FIG. 3(a) is a plan view showing the configuration of the semiconductor device of the prior art. FIG. 3(b) is a sectional view showing the configuration of the semiconductor device of the prior art, taken along line Y-Y' of FIG. 3(a). FIG. 3(c) is a plan view showing the main part of the semiconductor device in which the surface of a lead frame is plated according to the prior art.

In FIGS. 3(a) and 3(b), a power semiconductor device 101 has a semiconductor element 103 mounted on the die pad of a lead frame 102. A drain terminal 102a formed on the surface of the die pad and a drain electrode 103c of the semiconductor element 103 are bonded to each other.

On the surface of the semiconductor element 103, a source electrode 103a and a gate electrode 103b are formed. Further, the drain electrode 103c is formed on the back side of the semiconductor element 103.

Provided on the source electrode 103a is a relatively thin conductive ribbon 105. The conductive ribbon 105 is bonded to the source electrode 103a by ultrasonic bonding. On the conductive ribbon 105, a conductive ribbon 106 is provided that is larger in thickness than the conductive ribbon 105. The source electrode 103a and the conductive ribbon 106 are bonded by ultrasonic bonding with the conductive ribbon 105 interposed between the source electrode 103a and the conductive ribbon 106, so that a joint 108 is formed.

The other side of the conductive ribbon 106 is similarly bonded by ultrasonic bonding with the conductive ribbon 105 interposed between the conductive ribbon 106 and a source terminal 102b of the lead frame 102, so that a joint 108 is formed. By using the conductive ribbon 106 thus, a bonded area is increased and an electric resistance at the joint is reduced, so that a large current can be passed.

Further, the gate electrode 103b and a gate terminal 102c of the lead frame 102 are connected to each other via a conductive wire 109. This is because a large current does not pass between the gate electrode 103b and the gate terminal 102c. A wire bonding technique for, e.g., a gold wire is used according to the prior art.

The lead frame 102, the semiconductor element 103, the conductive ribbons 105 and 106, and the conductive wire 109 are resin molded with molding resin 112 to form the power semiconductor device 101 (e.g., see patent document 1).

In another semiconductor device of the prior art, when a semiconductor element is mounted on a lead frame via lead-free solder, the mounting region is partially plated with a precious metal to improve the reliability of mounting (e.g., see patent document 2).

In the prior art configuration of patent document 1, the relatively thin conductive ribbons 105 are first bonded and then the conductive ribbon 106 larger in thickness than the conductive ribbons 105 is bonded thereon by ultrasonic bonding. Thus it is possible to apply a larger pressure and ultrasonic power, so that the conductive ribbon 106 can be bonded with a cross sectional area large enough to reduce a bonding resistance. However, the semiconductor element 103 receives a stress at least twice because of heat and vibrations during ultrasonic bonding, so that the semiconductor element 103 disadvantageously becomes less reliable. Moreover, the use of different kinds of conductive ribbons results in a complicated ultrasonic bonding process and a complicated device and equipment, disadvantageously increasing the production cost.

In the prior art configuration of patent document 2, in order to improve the reliability of connection between different kinds of conductive bonding materials and the electrode of a semiconductor element and the lead terminal of a lead frame, the bonded region of the lead terminal may be partially plated depending upon the conductive bonding material.

Thus as shown in FIG. 3(c), a second coating 111 highly bondable to the conductive wire 109 is applied to a region bonded to the conductive wire 109 on the lead frame 102, and a first coating 110 highly bondable to the conductive ribbon 106 is applied to a region serving as the joint 108 bonded to the conductive ribbon 106 on the lead frame 102. The highly bondable coatings are applied to the terminals serving as the joints depending upon the conductive bonding materials, so that the bonding of the joints can be improved and a bonding resistance can be reduced. Thus a resistance can be sufficiently reduced without bonding at a single point several times.

CITATION LIST

Patent Documents

Patent document 1: Japanese Patent Laid-Open No. 2008-117825
Patent document 2: Japanese Patent Laid-Open No. 2009-54690

SUMMARY OF THE INVENTION

Problems to be Solved by the Invention

In a recent power MOS-FET, however, a source part is connected via an Al ribbon and a gate part is connected via an Au wire. The joint of the Al ribbon has to be plated with Ni and the joint of the Au wire has to be plated with Ag. Thus it is necessary to apply different coatings on respective terminals, resulting in complicated masking for partial plating in a plating process, a complicated device and equipment, and higher production cost.

The present invention has been devised to solve the problems of the prior art. An object of the present invention is to improve the reliability of bonding and easily reduce a bonding resistance while suppressing a decrease in the reliability of a semiconductor element.

Means for Solving the Problem

In order to attain the object, a semiconductor device of the present invention includes: a semiconductor element including at least a first electrode and a second electrode; a lead frame including at least a first terminal and a second terminal; a die pad serving as a region in which the semiconductor element is mounted on the lead frame; a first coating exposed on the outer surfaces of the first terminal and the second terminal; a second coating exposed on the inner surfaces of the first terminal and the second terminal; a first conductive bonding material connecting the first electrode and the first coating of the first terminal; a second conductive bonding material connecting the second electrode and the second coating of the second terminal; and molding resin for molding at least the semiconductor element, the first conductive bonding material, and the second conductive bonding material.

Preferably, the first conductive bonding material and the second conductive bonding material are different metals and the first coating and the second coating are made of different plating materials.

Preferably, the first coating exposed on the outer surfaces of the first terminal and the second terminal is applied like a strip having a width of at least 0.30 mm.

Preferably, the second coating exposed on the inner surfaces of the first terminal and the second terminal is applied like a strip having a width of at least 0.25 mm.

Preferably, bondability between the first conductive bonding material and the first coating and bondability between the second conductive bonding material and the second coating are higher than bondability between the first conductive bonding material and the second coating and bondability between the second conductive bonding material and the first coating.

The first conductive bonding material may be a conductive ribbon.

The first conductive bonding material may be an aluminum ribbon and the first coating may be one of a nickel coating and a copper coating.

The second conductive bonding material may be a gold wire and the second coating may be a silver coating.

Preferably, the first coating is applied like a strip over the first terminal and the second terminal and the die pad of the lead frame, and the second coating is applied, on the first coating, only to the inner surfaces of the first terminal and the second terminal.

The first coating may be applied over the surface of the lead frame, and the second coating may be applied, on the first coating, only to the inner surfaces of the first terminal and the second terminal.

The lead frame may be made of solid copper exposed instead of the first coating.

The semiconductor element may be a power semiconductor element, the first terminal may be a source terminal, the second terminal may be a gate terminal, the semiconductor device may further include a drain terminal extended from the die pad and a drain electrode formed on the mounting surface of the power semiconductor element, and the drain electrode may be electrically connected to the die pad.

A method of manufacturing the semiconductor device according to the present invention, in plating on the lead frame of the semiconductor device, the method including: forming the first coating at least on the outer surfaces of the first terminal and the second terminal; and forming the second coating at least on the inner surfaces of the first terminal and the second terminal.

Thus it is possible to improve the reliability of bonding and easily reduce a bonding resistance while suppressing a decrease in the reliability of the semiconductor element.

Advantage of the Invention

As has been discussed, terminals are divided into two along a common boundary, coatings most suitable for two conductive bonding materials to be used are exposed on the terminals, the most suitable one of the coatings is selected, and the corresponding conductive bonding material is bonded onto the coating. Thus it is possible to improve the reliability of bonding and easily reduce a bonding resistance while suppressing a decrease in the reliability of a semiconductor element.

BRIEF DESCRIPTION OF THE DRAWINGS

FIG. 2(a) is a process drawing showing a method of manufacturing a semiconductor device according to a second embodiment;

FIG. 2(b) is a process drawing showing the method of manufacturing the semiconductor device according to the second embodiment;

FIG. 2(c) is a process drawing showing the method of manufacturing the semiconductor device according to the second embodiment;

FIG. 2(d) is a process drawing showing the method of manufacturing the semiconductor device according to the second embodiment;

FIG. 2(e) is a process drawing showing the method of manufacturing the semiconductor device according to the second embodiment;

FIG. 2(f) is a process drawing showing the method of manufacturing the semiconductor device according to the second embodiment;

FIG. 2(g) is a process drawing showing the method of manufacturing the semiconductor device according to the second embodiment;

FIG. 2(h) is a process drawing showing the method of manufacturing the semiconductor device according to the second embodiment;

BEST MODE FOR CARRYING OUT THE INVENTION

In a semiconductor device of the present invention in which a semiconductor element is mounted on a lead frame having a plurality of terminals and a die pad, when multiple conductive bonding materials are used for electrically connecting the semiconductor element and the terminals of the lead frame, coatings of plating materials highly bondable with the conductive bonding materials to be bonded are exposed in the bonded regions of the terminals. Particularly, in the case of two conductive bonding materials, e.g., a conductive ribbon and a conductive wire connected to the terminals separated from the die pad, the bonded regions of the terminals are divided into two and coatings of different plating materials are formed in the respective divided regions such that the coatings are exposed in the divided regions. The coatings of different plating materials are exposed thus on the respective terminals and each of the conductive bonding materials is bonded on the most suitable one of the coatings, thereby improving bondability. Thus it is possible to reduce an electrical resistance at a joint and improve the reliability of bonding. Since the resistance can be reduced with the same bonded area, it is not necessary to form joints at multiple points, suppressing a deterioration of the characteristics of the semiconductor element. Further, the terminals are uniformly divided and the coatings of the respective plating materials are simultaneously formed in the respective divided regions, so that the most suitable coatings can be easily formed. In other words, in the prior art, the formation of a proper coating on each terminal results in a complicated process and device, whereas in the present invention, the multiple terminals are divided into two regions along a linear boundary and the predetermined coatings are simultaneously formed in the respective regions, so that two kinds of coatings can be easily formed on the terminals.

The following will describe embodiments of the present invention with reference to the accompanying drawings. A power semiconductor device will be described as an example of a semiconductor device.

First Embodiment

Figure 1A:
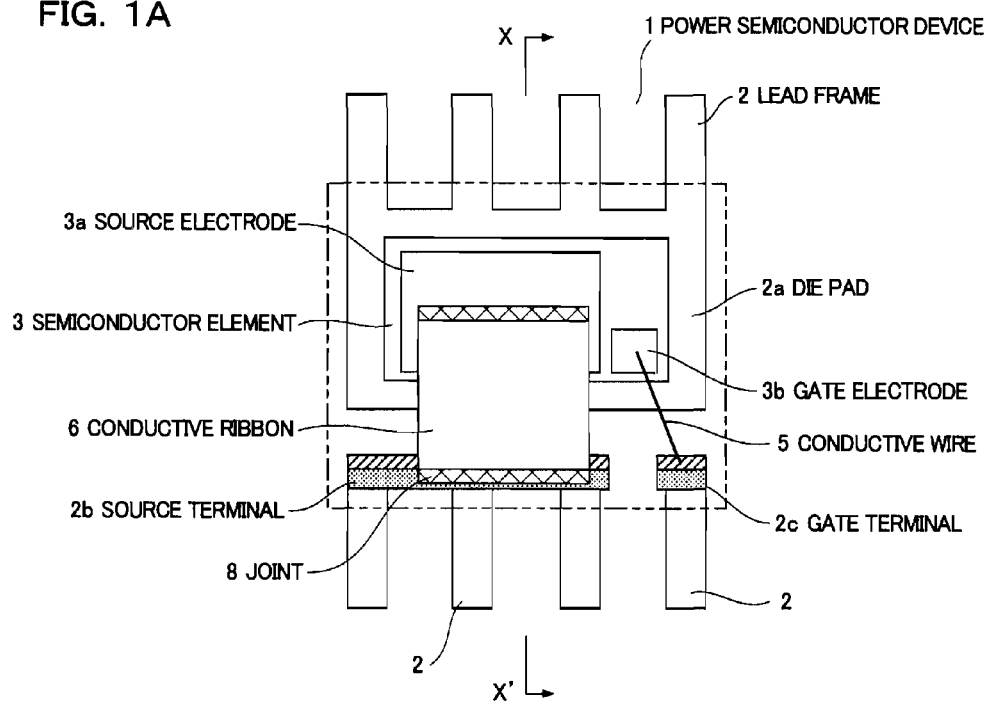
FIG. 1(a) is a plan view showing the configuration of a semiconductor device according to a first embodiment.
Figure 1B:
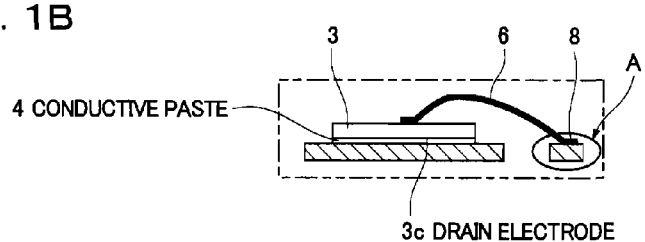
FIG. 1(b) is a sectional view showing the configuration of the semiconductor device according to the first embodiment.
Figure 1C:
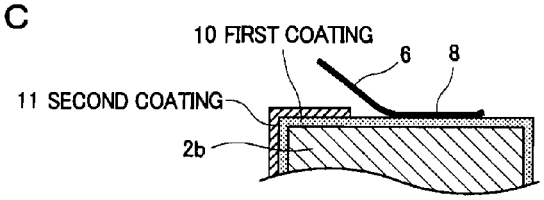
FIG. 1(c) is an enlarged view showing the main part of the configuration of the coatings of the semiconductor device according to the first embodiment.
Figure 3A:
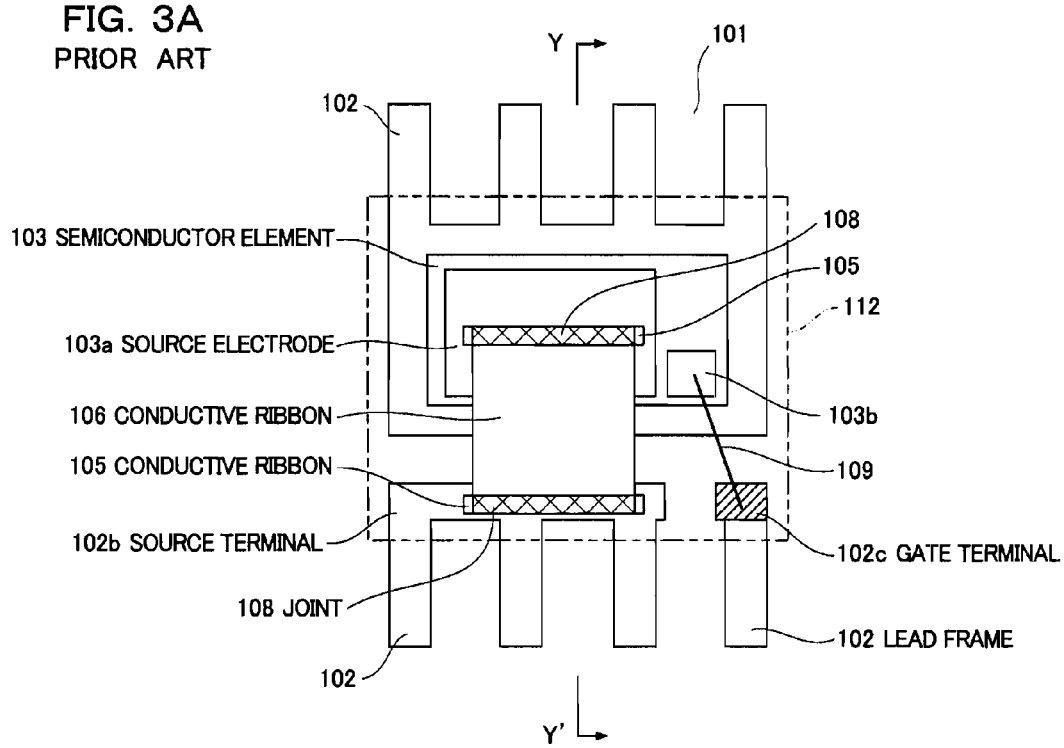
FIG. 3(a) is a plan view showing the configuration of a semiconductor device according to the prior art.
Figure 3B:
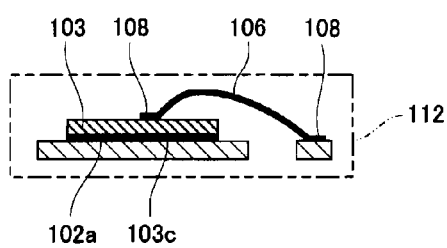
FIG. 3(b) is a sectional view showing the configuration of the semiconductor device according to the prior art.
Figure 3C:
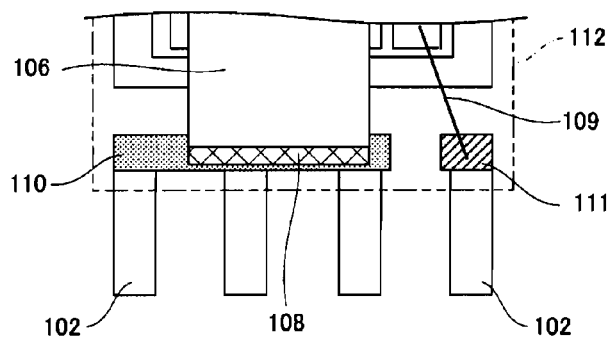
FIG. 3(c) is a plan view showing the main part of the semiconductor device in which the surface of a lead frame is plated according to the prior art.

FIG. 1(a) is a plan view showing the configuration of a semiconductor device according to a first embodiment. The plan view shows the internal configuration of a MOS-FET that is a power semiconductor device. FIG. 1(b) is a sectional view showing the configuration of the semiconductor device according to the first embodiment, taken along line X-X' of FIG. 1(a). FIG. 1(c) is an enlarged view showing the main part of the configuration of the coatings of the semiconductor device according to the first embodiment. FIG. 1(c) is also an enlarged view of part A of FIG. 1(b).

FIGS. 1(a) and 1(b) show a power semiconductor device 1 including a MOS-FET mounted as a semiconductor element 3 on a lead frame 2. On the major surface of the semiconductor element 3, a source electrode 3a and a gate electrode 3b are formed. The source electrode 3a and the gate electrode 3b are made up of conductive films, mainly Al films. The source electrode 3a is configured to have a larger area than the gate electrode 3b to reduce an on resistance. Further, a drain electrode 3c is formed over the back side of the semiconductor element 3 and the drain electrode 3c is bonded to a die pad 2a of the lead frame 2 via conductive paste 4 such as Ag paste.

This configuration is identical to that of the prior art.

The following will specifically describe the characteristics of the present invention.

The gate electrode 3b is connected to a gate terminal 2c of the lead frame 2 via a conductive wire 5 such as an Au wire.

The source electrode 3a is connected to a source terminal 2b of the lead frame 2 via a conductive ribbon 6. The conductive ribbon 6 is, for example, an Al ribbon that is wedge bonded by a bonding tool.

Over the surface of the lead frame 2 or at least on the surfaces of the source terminal 2b and the gate terminal 2c, a coating of Ni is applied as a first coating 10. On the surfaces of the source terminal 2b and the gate terminal 2c, a predetermined range of a region (hereinafter, will be called the inside) opposed to the die pad 2a is partially and selectively plated with Ag serving as a second coating 11. In other words, the second coating 11 is exposed on the insides of the surfaces of the source terminal 2b and the gate terminal 2c and the first coating 10 is exposed in a region (hereinafter, will be called the outside) where the second coating 11 is not applied, on the surfaces of the source terminal 2b and the gate terminal 2c. The gate electrode 3b and the gate terminal 2c are electrically connected to each other by connecting the second coating 11 exposed on the inside of the gate terminal 2c and the gate electrode 3b via the conductive wire 5. The source electrode 3a and the source terminal 2b are electrically connected to each other by connecting the first coating 10 exposed on the outside of the source terminal 2b and the source electrode 3a via the conductive ribbon 6 such as an Al ribbon. Consequently, bondability between the conductive ribbon 6 and the first coating 10 is higher than bondability between the conductive ribbon 6 and the second coating 11. Similarly, bondability between the conductive wire 5 and the second coating 11 is higher than bondability between the conductive wire 5 and the first coating 10.

In this configuration, the bonded region of the conductive wire 5 is an inner region on the surface of the gate terminal 2c. The length of the inner region on the surface of the gate terminal 2c in a perpendicular direction (hereinafter, will be called a ribbon length direction) to a side of the source terminal 2b, the side being opposed to the die pad 2a, that is, the width of the exposed portion of the second coating 11 shaped like a strip has to be large enough to sufficiently bond the conductive wire 5. For example, the width of the exposed portion of the second coating 11 is at least 0.25 mm, preferably 0.25 mm to 0.35 mm. Further, a joint 8 of the conductive ribbon 6 is an outer region on the surface of the source terminal 2b. The length of the outer region on the surface of the source terminal 2b in the ribbon length direction, that is, the width of the exposed portion of the first coating 10 shaped like a strip has to be large enough to sufficiently form the joint 8 of the conductive ribbon 6. For example, the width of the exposed portion of the first coating 10 is at least 0.30 mm, preferably 0.30 mm to 0.40 mm.

With this configuration, the first coating 10 of Ni is highly connectable to the conductive ribbon 6. The first coating 11 is exposed at the joint 8, thereby reducing an electric resistance at the joint of the conductive ribbon 6 and the source terminal 2b with higher bonding reliability. The second coating 11 of Ag is highly connectable to the conductive wire 5. The second coating 11 is exposed in the bonded region of the conductive wire 5 and the gate terminal 2c, thereby reducing an electric resistance at the joint of the conductive wire 5 and the gate terminal 2c with higher bonding reliability. Further, a bonding resistance can be reduced without performing a bonding operation several times on the semiconductor element 3. Thus the resistance can be reduced without affecting the reliability of the semiconductor element 3. Two kinds of coatings are formed simultaneously in the respective regions of the gate terminal 2c and the source terminal 2b and the most suitable coatings for the connected conductive materials can be applied to the terminals, achieving equipment and a device for a plating process with a simple configuration.

The second coating 11 highly adhesive to molding resin is applied to the insides of the source terminal 2b and the gate terminal 2c, and the first coating 10 less adhesive to the molding resin is applied to the outsides of the source terminal 2b and the gate terminal 2c. The second coating 11 on the insides strengthens resin molding and resin burrs can be easily removed after the resin molding of the first coating 10 on the outsides.

The foregoing explanation described the first coating 10 applied on the terminals. When the lead frame 2 is made of Cu, excellent connection to the conductive ribbon 6 can be obtained by exposing solid Cu without forming the first coating 10, effectively reducing the plating cost.

In the present embodiment, the single conductive ribbon 6 is connected. Multiple conductive ribbons 6 may be connected.

Second Embodiment

FIGS. 2(a), 2(c), 2(e), and 2(g) are process drawings showing a method of manufacturing a semiconductor device according to a second embodiment. FIGS. 2(b), 2(d), 2(f), and 2(h) are process drawings showing the method of manufacturing the semiconductor device according to the second embodiment. FIGS. 2(b), 2(d), 2(f), and 2(h) are sectional views taken along line X-X' or Z-Z' of FIGS. 2(a), 2(c), 2(e), and 2(g).

In FIGS. 2(a) to 2(h), a lead frame 2 is prepared that is made of copper or a copper alloy or an iron-nickel alloy. The lead frame 2 has a die pad 2a on which a semiconductor element 3 is placed; drain terminals 2d extended as second terminals from the die pad 2a; a source terminal 2b placed as a first terminal near the die pad 2a; and a gate terminal 2c serving as a third terminal. Further, Ag is applied as a first coating 10 over the surfaces of the source terminal 2b and the gate terminal 2c or at least on the outsides of the top surfaces of the source terminal 2b and the gate terminal 2c. Moreover, Ni is partially or selectively applied as a second coating 11 at least to the insides of the top surfaces of the source terminal 2b and the gate terminal 2c. At this point, the source terminal 2b and the gate terminal 2c are all divided into two regions along a boundary at equal distances from the closest side of the die pad 2a. Sequentially, the first coating 10 is formed in one of the regions in one operation and the second coating 11 is formed in the other region in one operation. After that, the lead frame 2 is placed on a die bonder (not shown) and then the semiconductor element 3 is placed on the die pad 2a. The semiconductor element 3 is, e.g., an IGBT and a MOS-FET. The following will describe a MOS-FET in which a source electrode 3a and a gate electrode 3b are formed on the major surface and a drain electrode 3c is formed substantially over the back side.

On the die pad 2a plated with Ag serving as the first coating 10, the drain electrode 3c of the semiconductor element 3 is connected via silver paste serving as conductive paste 4. The conductive paste 4 is heated and melted at 150° C. to 200° C. once, and then the conductive paste 4 is cooled to connect the drain electrode 3c (FIGS. 2(a) and 2(b)).

At this point, of the coatings on the top surfaces of the source terminal 2b and the gate terminal 2c of the lead frame 2, the first coating 11 is preferably exposed on the insides of the source terminal 2b and the gate terminal 2c and the second coating 10 is preferably exposed on the outsides of the source terminal 2b and the gate terminal 2c.

At this point, the first coating 11 is applied to the die pad 2a of the lead frame 2, so that the semiconductor element 3 and the lead frame 2 can be firmly bonded to each other via the conductive paste 4 and thus improve reliability against a thermal stress.

In other words, the first coating 11 may be applied over the surface of the lead frame 2 or at least on the top surfaces of the source terminal 2b and the gate terminal 2c. Further, the first coating 11 may be applied to the die pad 2a.

Next, the lead frame 2 on which the semiconductor element 3 is placed is set on a wedge bonder (not shown), the end of a wedge tool (not shown), on which an aluminum ribbon is supplied as a conductive ribbon 6, is pressed to the source electrode 3a, and ultrasonic vibrations are applied to the conductive ribbon 6, so that the conductive ribbon 6 is bonded to the source electrode 3a. Further, the end of the wedge tool (not shown) is moved and pressed to the source terminal 2b plated with Ni serving as the second coating 11 and ultrasonic vibrations are applied to the conductive ribbon 6, so that the conductive ribbon 6 is bonded to the source terminal 2b (FIGS. 2(c) and 2(d)).

At this point, in a region where the conductive ribbon 6 is bonded on the source terminal 2b, a coating of Ni is applied beforehand as the second coating 11 and thus improves a bonding strength between the source terminal 2b and the conductive ribbon 6. It is therefore possible to achieve stable wedge bonding on the conductive ribbon 6, improve the reliability of bonding, and reduce an on resistance.

Next, the lead frame 2 on which the semiconductor element 3 is placed is set on a wire bonder (not shown), a gold wire is supplied as a conductive wire 5, a bonding tool (not shown) on which a small ball is formed beforehand is pressed to the gate electrode 3b, and ultrasonic vibrations are applied to the conductive wire 5, so that the conductive wire 5 is bonded to the gate electrode 3b. After that, the bonding tool (not shown) is moved to a region where a coating of Ag is applied as the first coating 10 on the gate terminal 2c, and the conductive wire 5 is bonded to the gate terminal 2c (FIGS. 2(e) and 2(f)).

At this point, the coating of Ag is applied beforehand as the first coating 10 in a region where the conductive wire 5 is bonded on the gate terminal 2c, so that a bonding strength improves between the gate terminal 2c and the conductive wire 5. It is therefore possible to achieve stable wire bonding on the conductive wire 5 and improve the reliability of bonding.

Finally, the semiconductor element 3, the conductive ribbon 6, the conductive wire 5, and the inner portions of the terminals are resin molded with resin 9 (FIG. 2(e)).

At this point, the coating of Ni is applied as the second coating 11 on the insides of the source terminal 2b and the gate terminal 2c to improve adhesion between the resin 9 and the lead frame 2 and the coating of Ag is applied as the first coating 10 on the outsides of the terminals. Thus it is possible to easily remove resin burrs.

In the foregoing explanation, a power semiconductor device was described as an example of a semiconductor device. The mounted semiconductor element is not limited to a power semiconductor element but is applicable to any kind of semiconductor devices. Further, in the foregoing explanation, the semiconductor device has three kinds of terminals. The present invention is applicable to a semiconductor device having multiple terminals including two kinds of terminals connected via at least two different conductive bonding materials such as a conductive ribbon and a conductive wire.

INDUSTRIAL APPLICABILITY

The present invention is useful for a semiconductor device in which terminals are electrically connected via multiple conductive bonding materials, and a method of manufacturing the same by which it is possible to improve the reliability of bonding and easily reduce a bonding resistance while suppressing a decrease in the reliability of a semiconductor element.

The invention claimed is:

1. A semiconductor device comprising:
   a semiconductor element including at least a first electrode and a second electrode;
   a lead frame including a first a plurality of terminals;
   a die pad serving as a region in which the semiconductor element is mounted on the lead frame;
   a first terminal and a second terminal of the plurality of terminals being adjacent to each other, each of the first terminal and the second terminal having a side surface that opposes to a side surface of the die pad, each of the first terminal and the second terminal having a first area closer to the die pad and a second area farther from the die pad, the first and the second areas of each of the first terminal and the second terminal being divided by a line parallel to the side of the die pad;
   a first coating that is an uppermost layer of the second area of each of the first terminal and the second terminal;
   a second coating that is an uppermost layer of the first area of each of the first terminal and the second terminal;
   a first conductive bonding material directly connecting the first electrode and the first coating of the first terminal;
   a second conductive bonding material directly connecting the second electrode and the second coating of the second terminal; and
   molding resin for molding at least the semiconductor element, the first conductive bonding material, and the second conductive bonding material.

2. The semiconductor device according to claim 1, wherein the first conductive bonding material and the second conductive bonding material are different metals and the first coating and the second coating are made of different plating materials.

3. The semiconductor device according to claim 1, wherein the first coating is applied like a strip having a width of at least 0.30 mm.

4. The semiconductor device according to claim 1, wherein the second coating is applied like a strip having a width of at least 0.25 mm.

5. The semiconductor device according to claim 2, wherein
   bondability between the first conductive bonding material and the first coating is higher than bondability between the first conductive bonding material and the second coating,
   bondability between the first conductive bonding material and the first coating is higher than bondability between the second conductive bonding material and the first coating,
   bondability between the second conductive bonding material and the second coating is higher than bondability between the first conductive bonding material and the second coating, and
   bondability between the second conductive bonding material and the second coating is higher than bondability between the second conductive bonding material and the first coating.

6. The semiconductor device according to claim 5, wherein the first conductive bonding material is a conductive ribbon.

7. The semiconductor device according to claim 5, wherein the first conductive bonding material is an aluminum ribbon and the first coating is one of a nickel coating and a copper coating.

8. The semiconductor device according to claim 7, wherein the second conductive bonding material is a gold wire and the second coating is a silver coating.

9. The semiconductor device according to claim 8, wherein the first coating is applied like a strip over the first terminal and the second terminal and the die pad of the lead frame, and the second coating is applied so as to cover the first coating only on the first areas of each of the first terminal and the second terminal.

10. The semiconductor device according to claim 8, wherein the first coating is applied over a surface of the lead frame, and the second coating is applied so as to cover the first coating only on the first areas of each of the first terminal and the second terminal.

11. The semiconductor device according to claim 7, wherein the lead frame is made of solid copper exposed instead of the first coating.

12. The semiconductor device according to claim 8, wherein the semiconductor element is a power semiconductor element, the first terminal is a source terminal, the second terminal is a gate terminal, the semiconductor device further comprises a drain terminal extended from the die pad and a drain electrode formed on a mounting surface of the power semiconductor element, and the drain electrode is electrically connected to the die pad.

13. A method of manufacturing the semiconductor device according to claim 5, the method comprising:
    plating on the lead frame of the semiconductor device; the plating further comprising:
    forming the first coating at least on the uppermost layer of the second area of each of the first terminal and the second terminal; and
    forming the second coating at least on the uppermost layer of the first area of each of the first terminal and the second terminal.

* * * * *